United States Patent
Noguchi et al.

(10) Patent No.: US 12,413,041 B2
(45) Date of Patent: Sep. 9, 2025

(54) OPTICAL MODULE WITH TWO DIFFERENTIAL TRANSMISSION LINE PAIRS WITH DIFFERENT LENGTHS DESIGNED TO CANCEL PHASE SHIFT AND STABILIZE HIGH-FREQUENCY SIGNAL

(71) Applicant: CIG Photonics Japan Limited, Kanagawa (JP)

(72) Inventors: Daisuke Noguchi, Tachikawa (JP); Hiroshi Yamamoto, Inagi (JP)

(73) Assignee: CIG PHOTONICS JAPAN LIMITED, Kanagawa (JP)

( * ) Notice: Subject to any disclaimer, the term of this patent is extended or adjusted under 35 U.S.C. 154(b) by 946 days.

(21) Appl. No.: 17/239,731

(22) Filed: Apr. 26, 2021

(65) Prior Publication Data

US 2021/0351563 A1 Nov. 11, 2021

(30) Foreign Application Priority Data

May 11, 2020 (JP) .................................. 2020-083403

(51) Int. Cl.
*H01S 5/02345* (2021.01)
*G02B 6/42* (2006.01)
(Continued)

(52) U.S. Cl.
CPC ........ *H01S 5/02345* (2021.01); *G02B 6/4279* (2013.01); *G02B 6/428* (2013.01);
(Continued)

(58) Field of Classification Search
CPC .. H01S 5/02345; H01S 5/02212; H01S 5/023; H01S 5/02415; G02B 6/4279;
(Continued)

(56) References Cited

U.S. PATENT DOCUMENTS 6,347,041 B1 * 2/2002 Hailey ................. H05K 1/0216
174/250
7,180,011 B1 * 2/2007 Hall ..................... H05K 1/0245
257/776
(Continued)

FOREIGN PATENT DOCUMENTS

CN 106486440 A 3/2017
CN 106887471 A 6/2017
(Continued)

OTHER PUBLICATIONS

Japanese Office Action received in corresponding Japanese Application No. 2020-083403 dated Dec. 26, 2023.
(Continued)

*Primary Examiner* — M. A. Golub-Miller
(74) *Attorney, Agent, or Firm* — MATTINGLY & MALUR, PC

(57) ABSTRACT

Each of the pair of lead pins has a first portion protruding from the first surface and a second portion protruding from the second surface. Each of the pair of first lines is connected to the first portion. Each of the pair of second lines is connected to the second portion. A photoelectric device is electrically connected to the pair of first lines. A longer one of the pair of first lines is electrically connected to a shorter one of the pair of second lines, through a corresponding one of the pair of lead pins. A shorter one of the pair of first lines is electrically connected to a longer one of the pair of second lines, through another corresponding one of the pair of lead pins.

2 Claims, 6 Drawing Sheets

(51) Int. Cl.
  *H01S 5/02212* (2021.01)
  *H01S 5/023* (2021.01)
  *H01S 5/024* (2006.01)
  *H05K 1/02* (2006.01)
  *H10F 77/00* (2025.01)
  *H10F 77/60* (2025.01)

(52) U.S. Cl.
  CPC ........... *H05K 1/0245* (2013.01); *H10F 77/93* (2025.01); *H01S 5/02212* (2013.01); *H01S 5/023* (2021.01); *H01S 5/02415* (2013.01); *H10F 77/60* (2025.01)

(58) Field of Classification Search
  CPC . G02B 6/428; H01L 31/02002; H01L 31/024; H05K 1/0245
  See application file for complete search history.

(56) References Cited

U.S. PATENT DOCUMENTS

| | | | |
|---|---|---|---|
| 7,416,351 B2* | 8/2008 | Fujimura | G02B 6/4279 257/467 |
| 10,001,610 B2* | 6/2018 | Komatsu | G02B 6/4246 |
| 11,089,683 B2* | 8/2021 | Noguchi | H05K 1/0215 |
| 11,125,957 B2* | 9/2021 | Noguchi | H01S 5/02212 |
| 11,456,393 B2* | 9/2022 | Noguchi | H01L 31/02005 |
| 2003/0180013 A1 | 9/2003 | Rosenberg et al. | |
| 2005/0084201 A1* | 4/2005 | Akashi | G02B 6/4201 385/33 |
| 2005/0121684 A1* | 6/2005 | Aruga | G02B 6/4292 257/98 |
| 2005/0185882 A1* | 8/2005 | Zack | G02B 6/4256 385/15 |
| 2005/0214957 A1* | 9/2005 | Kihara | H01S 5/02216 438/106 |
| 2006/0066417 A1 | 3/2006 | Yamanaga et al. | |
| 2007/0031091 A1* | 2/2007 | Mitamura | H05K 1/147 385/88 |
| 2007/0063783 A1* | 3/2007 | Kanno | H01P 3/081 333/4 |
| 2007/0194431 A1* | 8/2007 | Corisis | H05K 1/0296 174/250 |
| 2010/0206625 A1* | 8/2010 | Maetani | H05K 1/0248 174/261 |
| 2010/0232480 A1* | 9/2010 | Bhandal | H01L 23/642 375/219 |
| 2015/0370954 A1* | 12/2015 | Shen | G06F 30/394 716/126 |
| 2017/0064831 A1 | 3/2017 | Noguchi et al. | |
| 2017/0168255 A1 | 6/2017 | Komatsu et al. | |
| 2017/0264074 A1* | 9/2017 | Noguchi | H01S 5/06226 |
| 2017/0264260 A1* | 9/2017 | Fukuchi | H01L 23/49827 |
| 2019/0123410 A1* | 4/2019 | Zihir | H01P 3/026 |
| 2019/0377143 A1* | 12/2019 | Tsuchiyama | G02B 6/421 |
| 2020/0203922 A1 | 6/2020 | Zhang | |
| 2020/0292764 A1* | 9/2020 | Kamitsuna | G02B 6/421 |
| 2021/0033806 A1* | 2/2021 | Noguchi | G02B 6/4281 |
| 2021/0132305 A1* | 5/2021 | Noguchi | G02B 6/4281 |
| 2021/0255406 A1* | 8/2021 | Saeki | G02B 6/4244 |
| 2022/0015233 A1* | 1/2022 | Farkas | H05K 1/116 |

FOREIGN PATENT DOCUMENTS

| | | |
|---|---|---|
| JP | 2005191088 A | 7/2005 |
| JP | 2006-128618 A | 5/2006 |
| JP | 2007-287471 A | 11/2007 |
| JP | 2019-186379 A | 10/2019 |
| WO | 2018219318 A1 | 12/2018 |

OTHER PUBLICATIONS

Chinese Office Action received in corresponding Chinese Application No. 202110506060.0 dated Jan. 2, 2024.

* cited by examiner

OPTICAL MODULE WITH TWO DIFFERENTIAL TRANSMISSION LINE PAIRS WITH DIFFERENT LENGTHS DESIGNED TO CANCEL PHASE SHIFT AND STABILIZE HIGH-FREQUENCY SIGNAL

CROSS-REFERENCE TO RELATED APPLICATION

The present application claims priority from Japanese patent application JP2020-083403 filed on May 11, 2020, the contents of which are hereby incorporated by reference into this application.

BACKGROUND

1. Field

The disclosure relates to an optical module.

2. Description of the Related Art

Optical modules are known which convert between electrical and optical signals. WO2018/219318A1 discloses a structure that enables stable transmission of a high-frequency signal in a single-ended transmission line. JP2005-191088A discloses a structure to which a differential transmission line pair is applied.

The differential transmission line pair can stabilize the high-frequency signal by transmitting signals with phases inverted by 180 degrees, through a pair of lines. However, difference in length of the pair of lines results in phase shift, making the high-frequency signal unstable.

SUMMARY

The disclosure aims at stabilizing a high-frequency signal.

(1) An optical module includes: a conductive block having a first surface and a second surface; a pair of lead pins passing through and insulated from the conductive block, each of the pair of lead pins having a first portion protruding from the first surface and a second portion protruding from the second surface; a first substrate having a pair of first lines with different lengths, each of the pair of first lines connected to the first portion, the pair of first lines being a first differential transmission line pair; a second substrate having a pair of second lines with different lengths, each of the pair of second lines connected to the second portion, the pair of second lines being a second differential transmission line pair; and a photoelectric device electrically connected to the pair of first lines, the photoelectric device configured to convert an optical signal and an electrical signal at least from one to another. A longer one of the pair of first lines is electrically connected to a shorter one of the pair of second lines, through a corresponding one of the pair of lead pins. A shorter one of the pair of first lines is electrically connected to a longer one of the pair of second lines, through another corresponding one of the pair of lead pins.

The longer first line and the shorter second line are electrically connected, and the shorter first line and the longer second line are electrically connected, thereby canceling phase shift and stabilizing a high-frequency signal.

(2) In the optical module according to (1), the first substrate may have a surface, on which the pair of first lines are formed, expanding in a direction intersecting the first surface. The second substrate may have a surface, on which the pair of second lines are formed, expanding along the second surface.

(3) In the optical module according to (2), the pair of lead pins may extend in a first direction and are arranged adjacent to each other in a second direction intersecting the first direction. The pair of first lines may be arranged adjacent to each other in the second direction. The pair of second lines may extend from the pair of lead pins in a third direction intersecting both the first direction and the second direction, curve, and extend in one of both ways along the second direction.

(4) In the optical module according to (3), the one of both ways may be a direction from the shorter one to the longer one of the pair of first lines.

(5) In the optical module according to any one of (1) to (4), the pair of first lines may have respective first curved portions bent in a same direction, one of the respective first curved portions on an outer side being longer. The pair of second lines may have respective second curved portions bent in a same direction, one of the respective second curved portions on an outer side being longer.

(6) In the optical module according to (5), the pair of second lines may have the respective second curved portions adjacent to respective junctions with the pair of lead pins.

(7) In the optical module according to (6), the pair of second lines may have the respective second curved portions at positions overlapping with the first substrate in a direction in which the pair of lead pins extend.

(8) The optical module according to any one of (1) to (7), may further include a mounting substrate on which the photoelectric device is mounted. The first substrate may be located deviating in a direction from a center of the first surface to an end portion thereof. The mounting substrate may be located deviating in a direction closer to the first substrate from the center of the first surface.

(9) The optical module according to (8), may further include: a thermoelectric cooler having an upper surface and a lower surface, the thermoelectric cooler at the lower surface fixed to the center of the first surface of the conductive block, the thermoelectric cooler containing a Peltier device configured to transfer heat between the upper surface and the lower surface; and a support block fixed to the upper surface of the thermoelectric cooler, the support block located deviating in a direction closer to the first substrate from the center of the first surface. The mounting substrate may be mounted on the support block.

DETAILED DESCRIPTION

Figure 1:
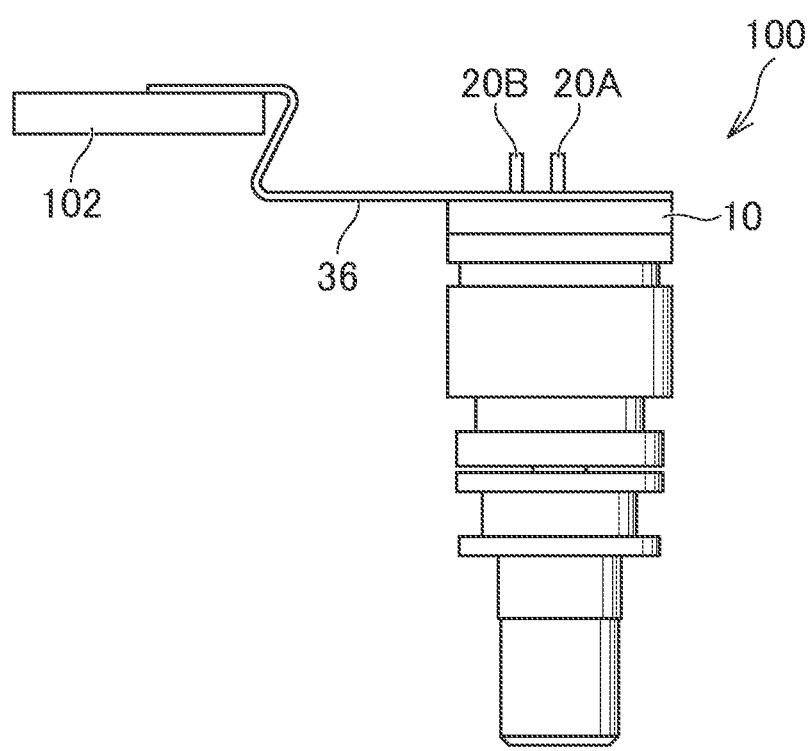
FIG. 1 is a side view of an optical module in an embodiment.

Hereinafter, some embodiments will be described specifically and in detail with reference to drawings. In all the drawings, the members with the same reference numerals have the identical or same feature and their repetitive description will be omitted. Sizes of figures do not always comply with magnification.

FIG. 1 is a side view of an optical module in an embodiment. The optical module 100 is a TO-CAN (Transistor Outline-Can) type optical module, and may be any of a transmitter optical sub-assembly (TOSA) with a light emitting device, a receiver optical sub-assembly (ROSA) with a light receiving device, and a bi-directional optical sub-assembly with both a light emitting device and a light receiving device (BOSA). The optical module 100 has a conductive block 10 (e.g., eyelet).

Figure 2:
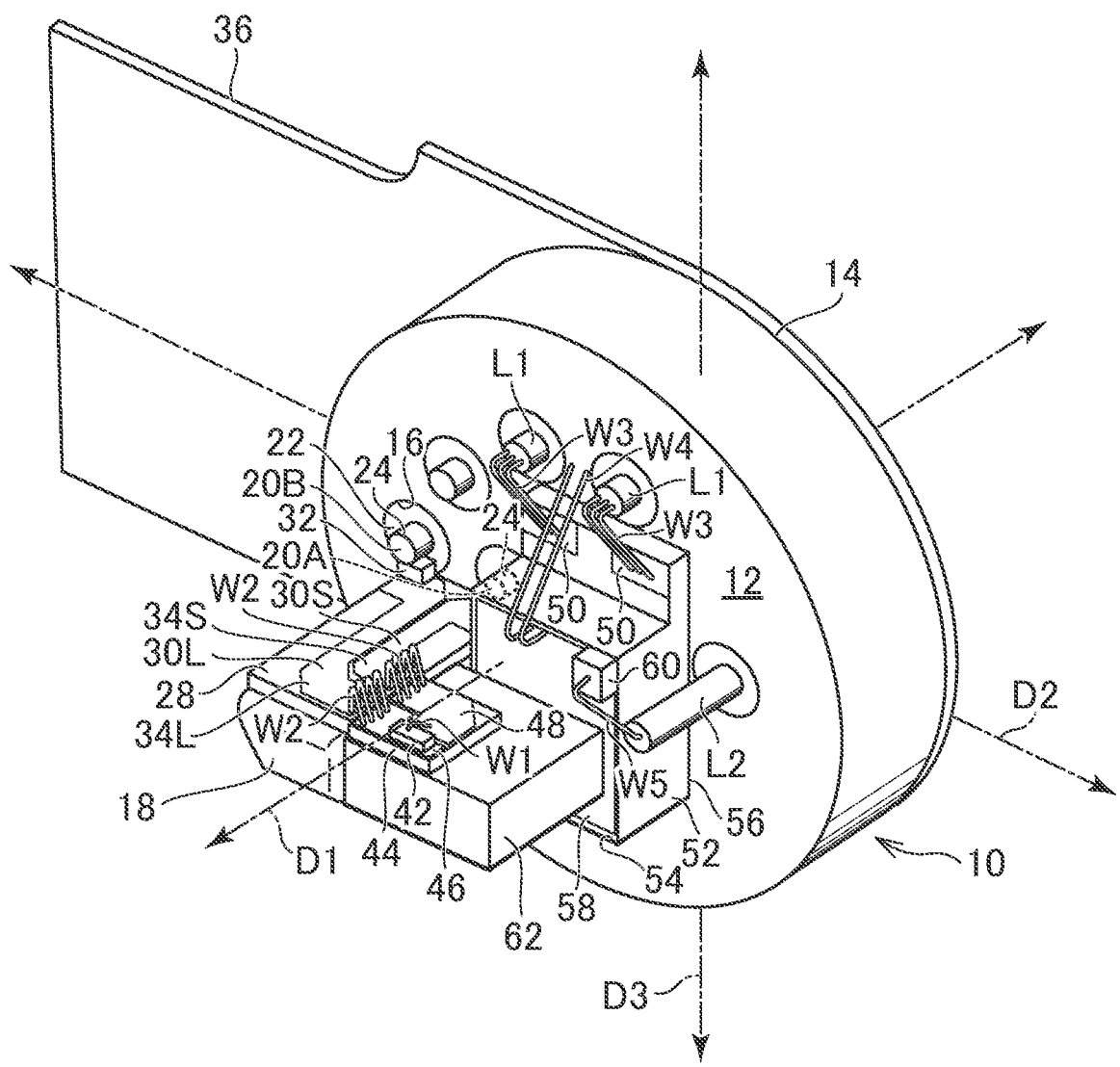
FIG. 2 is a perspective view of a conductive block and electronic components mounted on it.
Figure 3:
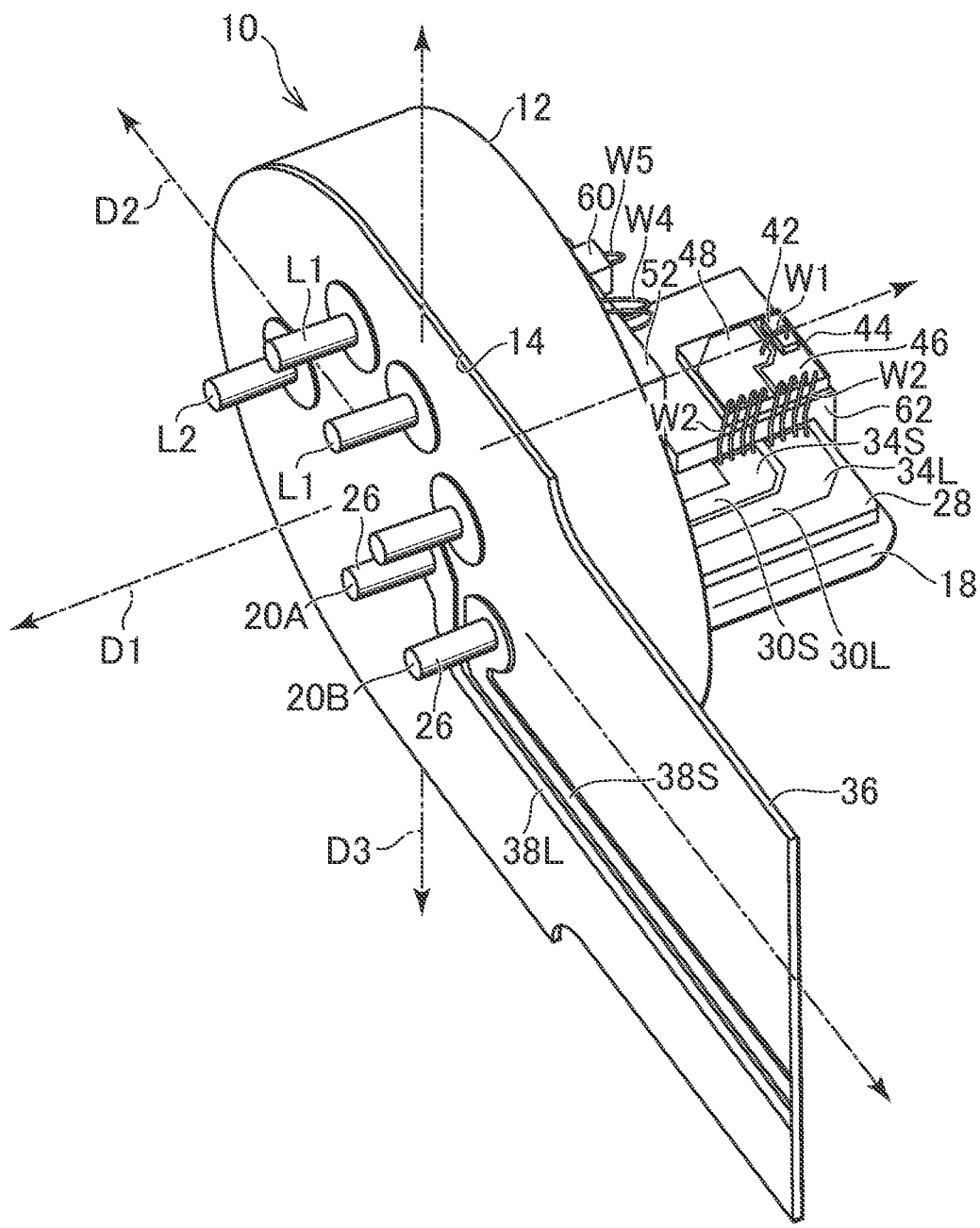
FIG. 3 is a perspective view, opposite to FIG. 2, of the conductive block and the electronic components mounted on it.

FIG. 2 is a perspective view of the conductive block and electronic components mounted on it. FIG. 3 is a perspective view, opposite to FIG. 2, of the conductive block 10 and the electronic components mounted on it.

The conductive block 10 is made of a conductive material such as metal, and has a first surface 12 and a second surface 14. The conductive block 10 has some through holes 16 penetrating between the first surface 12 and the second surface 14. The conductive block 10 has a pedestal portion 18 integral to the first surface 12. The pedestal portion 18 is raised on the first surface 12. The pedestal portion 18 is also made of a conductor. The conductive block 10 is connected to a reference potential, e.g., ground.

[Pair of Lead Pins]

The optical module 100 includes a pair of lead pins 20A, 20B. The pair of lead pins 20A, 20B extend in a first direction D1. The pair of lead pins 20A, 20B are arranged adjacent to each other in a second direction D2 intersecting or perpendicular to the first direction D1. Each of the pair of lead pins 20A, 20B passes through and is insulated from the conductive block 10. For example, the through hole 16 of the conductive block 10 is filled with an insulating material 22 such as glass. Each of the pair of lead pins 20A, 20B has a first portion 24 protruding from the first surface 12. Each of the pair of lead pins 20A, 20B has a second portion 26 protruding from the second surface 14.

[First Substrate]

The optical module 100 has a first substrate 28 (e.g., a relay substrate). The first substrate 28 is mounted on the pedestal 18. The first substrate 28 has a pair of first lines 30S, 30L formed thereon, constituting a first differential transmission line pair. Each of the pair of first lines 30S, 30L is bonded to the first portion 24 of a corresponding one of the pair of lead pins 20A, 20B. Instead of using a wire, a filler metal 32 (solder, brazing material) is used for the bonding.

The first substrate 28 has a surface, on which the pair of first lines 30S, 30L are formed, that spreads in a direction (e.g., the first direction D1) intersecting (e.g., perpendicular to) the first surface 12. The first substrate 28 deviates in a direction from the center of the first surface 12 to the end portion. The pair of first lines 30S, 30L are arranged adjacent to each other in the second direction D2. The pair of first lines 30S, 30L have first curved portions 34S, 34L, respectively. The first curved portions 34S, 34L of the pair of first lines 30S, 30L are bent in the same direction. The first curved portion 34L on the outer side is longer, whereby the pair of first lines 30S, 30L are different in length from each other.

[Second Substrate]

The optical module 100 includes a second substrate 36 such as a flexible substrate (FPC). The second substrate 36 is opposed to the second surface 14. As shown in FIG. 1, a printed circuit board (PCB) 102 is connected to the second substrate 36.

The second substrate 36 has a pair of second lines 38S, 38L formed thereon, constituting a second differential transmission line pair. Each of the pair of second lines 38S, 38L is bonded to the second portion 26 of a corresponding one of the pair of lead pins 20A, 20B. The second substrate 36 has a surface, on which the pair of second lines 38S, 38L are formed, that spreads along the second surface 14.

Figure 4:
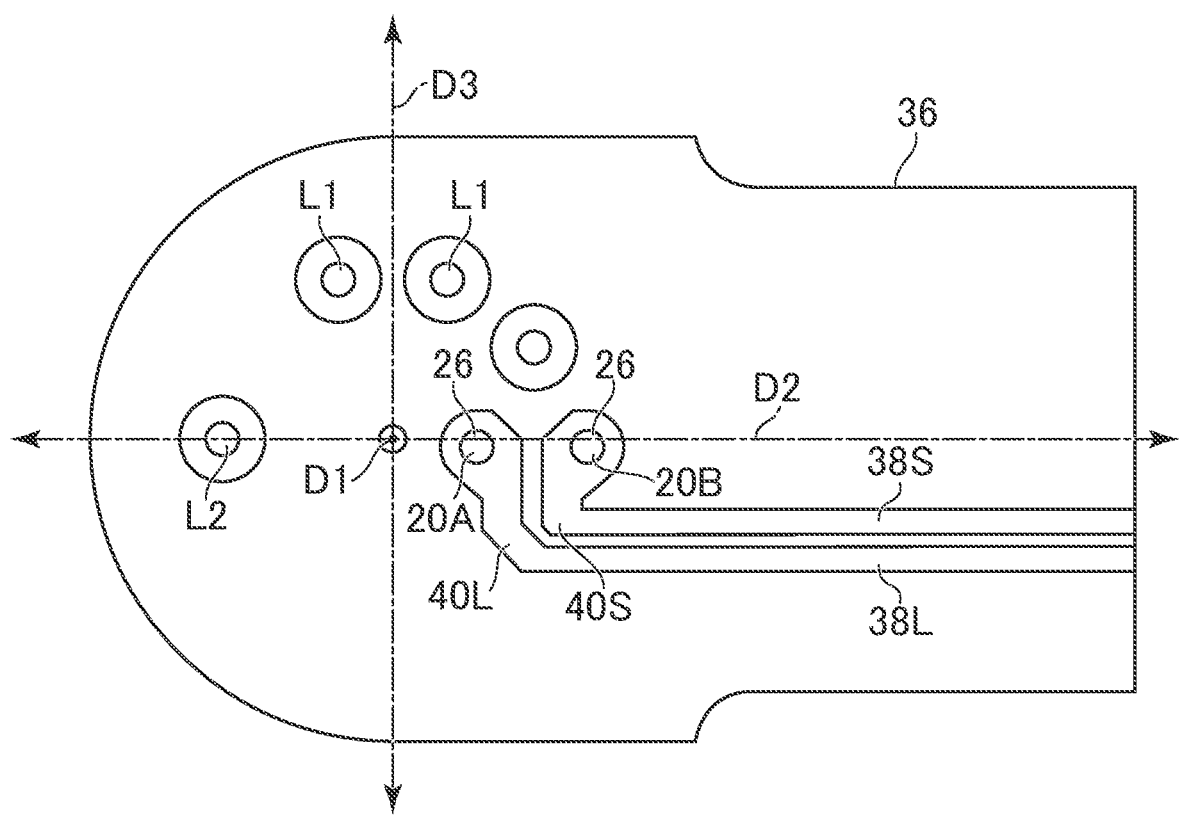
FIG. 4 is a plan view of a pair of lead pins and a second substrate.

FIG. 4 is a plan view of the pair of lead pins 20A, 20B and the second substrate 36. Each of the pair of second lines 38S, 38L extends from a corresponding one of the pair of lead pins 20B, 20A. The lead-out direction is a third direction D3 that intersects (e.g., perpendicular to) both the first direction D1 and the second direction D2.

The pair of second lines 38S, 38L are bent and have second curved portions 40S, 40L, respectively. The pair of second lines 38S, 38L have second curved portion 40S, 40L adjacent to junctions with the lead pins 20B, 20A, respectively. The second curved portions 40S, 40L overlap with the first substrate 28 in a direction (first direction D1) in which the pair of lead pins 20B, 20A extend (FIG. 2).

The second curved portions 40S, 40L of the pair of second lines 38S, 38L are bent in the same direction. The second curved portion 40L on the outer side is longer, whereby the pair of second lines 38S, 38L are different in length from each other. The pair of second lines 38S, 38L extend in one of both ways along the second direction D2 from the second curved portion 40S, 40L, respectively. The one of both ways is, for example, the direction from the shorter first line 30S (corresponding one lead pin 20A) to the longer first line 30L (corresponding other lead pin 20B).

[Connection of First Line and Second Line]

The longer first line 30L is electrically connected to the shorter second line 38S through the one lead pin 20B. The shorter first line 30S is electrically connected to the longer second line 38L through the other lead pin 20A. This can cancel phase shift of the differential signal pair and stabilize a high-frequency signal.

[Photoelectric Device]

The optical module 100 has a photoelectric device 42 for converting an optical signal and an electrical signal at least from one to another. The photoelectric device 42 is mounted on the mounting substrate 44. The mounting substrate 44 deviates in a direction closer to the first substrate 28 from the center of the first surface 12.

The mounting substrate 44 has a first electrode 46 and a second electrode 48. The bottom surface of the photoelectric device 42 is opposed to and electrically connected to the first electrode 46. A pad on the upper surface of the photoelectric device 42 is electrically connected to the second electrode 48 through a wire W1. Each of the first electrode 46 and second electrode 48 is electrically connected to a corresponding one of the pair of first lines 30S, 30L, through one or more wires W2. Thus, the photoelectric device 42 is electrically connected to the pair of first lines 30S, 30L.

[Thermoelectric Cooler]

The optical module 100 has a thermoelectric cooler 52. The thermoelectric cooler 52 has an upper surface 54 and a lower surface 56. The upper surface 54 and the lower surface 56 are made of an insulator such as ceramics. The lower surface 56 is fixed to the first surface 12 of the conductive block 10. A thermally conductive adhesive may be used for fixing. The thermoelectric cooler 52 contains an unillustrated Peltier device therein for transferring heat between the upper surface 54 and the lower surface 56. For example, the upper surface 54 is a heat absorbing surface and the lower surface 56 is a heat radiating surface, or vice versa by switching. The thermoelectric cooler 52 at the lower surface 56 is fixed to a center of the first surface 12 of the conductive block 10. Thermoelectric cooler 52 has an electrode 50 connected to a lead pin L1 by a wire W3.

The thermoelectric cooler 52 has a conductive layer 58 laminated on the upper surface 54. The conductive layer 58 is a reference potential plane (e.g., ground plane). Two or more wires W4 connect the first surface 12 of the conductive block 10 and the conductive layer 58. Thus, the potential of the conductive layer 58 is the same as the conductive block 10 and is stabilized. A thermistor 60 rests on and is electrically connected to the conductive layer 58 for measuring temperature. The thermistor 60 is connected to a lead pin L2 through a wire W5 to be supplied with a voltage.

[Support Block]

The optical module 100 has a support block 62. The support block 62 is fixed to the upper surface 54 (above the conductive layer 58) of the thermoelectric cooler 52. The support block 62 deviates in a direction closer to the first substrate 28 from the center of the first surface 12. The mounting substrate 44 is mounted on the support block 62.

Figure 5:
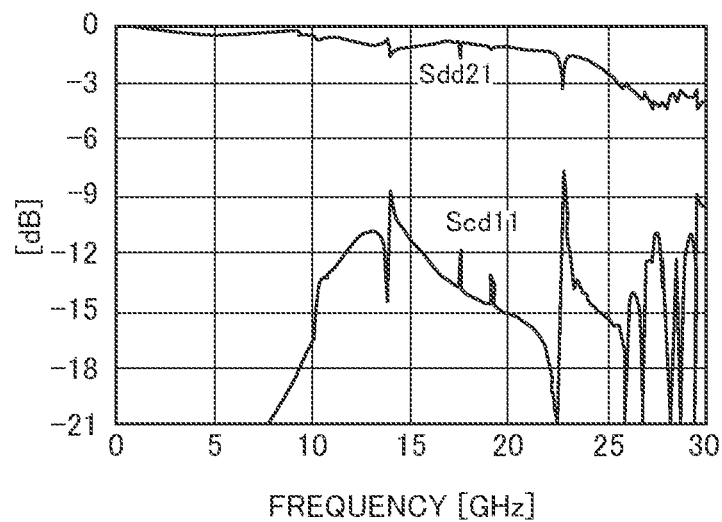
FIG. 5 is a diagram of frequency characteristics, in a reference example, obtained by simulation using a three-dimensional electric field analysis tool.

FIG. 5 is a diagram of frequency characteristics, in a reference example, obtained by simulation using a three-dimensional electric field analysis tool. Sdd21 indicates transmission properties of the differential signal pair. Scd11 indicates reflective properties of the reflected and returned common-mode components. In the reference example, the lengths of the pair of lines of the differential transmission line pair are kept different, and the differential signal pair is out of phase. Therefore, differential mode noises are converted to common mode noises, apparently affecting the signal quality.

Figure 6:
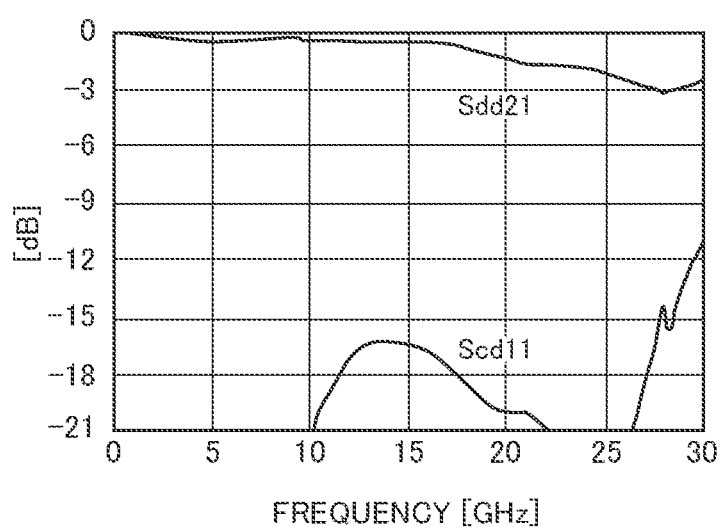
FIG. 6 is a diagram of frequency characteristics, in the embodiment, obtained by simulation using the three-dimensional electric field analysis tool.

FIG. 6 is a diagram of frequency characteristics, in the embodiment, obtained by simulation using the three-dimensional electric field analysis tool. In the present embodiment, as described above, the phase shift of the differential signal pair is canceled. As a result, compared with the reference example, the conversion to the common mode is suppressed, apparently improving the reflection characteristics (Scd11).

The embodiments described above are not limited and different variations are possible. The structures explained in the embodiments may be replaced with substantially the same structures and other structures that can achieve the same effect or the same objective.

What is claimed is:

1. An optical module comprising:
   a conductive block having a first surface and a second surface;
   a pair of lead pins passing through and insulated from the conductive block, the pair of lead pins having respective first portions protruding from the first surface and respective second portions protruding from the second surface;
   a first substrate having a pair of first lines with different lengths, each of the pair of first lines connected to a corresponding one of the first portions, the pair of first lines being a first differential transmission line pair;
   a second substrate having a pair of second lines with different lengths, each of the pair of second lines connected to a corresponding one of the second portions, the pair of second lines being a second differential transmission line pair; and
   a photoelectric device electrically connected to the pair of first lines, the photoelectric device configured to perform one of the following functions: 1) convert an optical signal to an electrical signal or 2) convert an electrical signal to an optical signal,
   wherein
   a longer one of the pair of first lines is electrically connected to a shorter one of the pair of second lines, through a corresponding one of the pair of lead pins,
   a shorter one of the pair of first lines is electrically connected to a longer one of the pair of second lines, through another corresponding one of the pair of lead pins,
   the first substrate has a surface on which the pair of first lines are formed, and which extends along a first axis, perpendicular to the first surface,
   the second substrate has a surface on which the pair of second lines are formed, and which extends along a second axis, parallel to the first surface,
   the pair of lead pins extend along the first axis and are arranged adjacent to each other along the second axis,
   the pair of first lines are arranged adjacent to each other along the second axis, and
   the pair of second lines each have first portions extending from the pair of lead pins along a third axis perpendicular to both the first axis and the second axis, second curved portions, and third portions extending along the second axis.

2. The optical module according to claim 1 wherein the third portions extend along the second axis in a direction from the shorter one to the longer one of the pair of first lines.

* * * * *